United States Patent
Lin (10) Patent No.: US 9,160,518 B1
(45) Date of Patent: Oct. 13, 2015

(54) HALF-RATE CLOCK-DATA RECOVERY CIRCUIT AND METHOD THEREOF

(71) Applicant: Realtek Semiconductor Corporation, HsinChu (TW)

(72) Inventor: Chia-Liang Leon Lin, Fremont, CA (US)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/501,981

(22) Filed: Sep. 30, 2014

(51) Int. Cl.
*H04L 7/00* (2006.01)
*H04L 7/04* (2006.01)
*H04L 7/033* (2006.01)

(52) U.S. Cl.
CPC ............ *H04L 7/0016* (2013.01); *H04L 7/0008* (2013.01); *H04L 7/033* (2013.01); *H04L 7/04* (2013.01); *H04L 7/0054* (2013.01)

(58) Field of Classification Search
CPC ......... H03L 7/087; H04L 7/033; H04L 7/008; H04L 7/0075
See application file for complete search history.

(56) References Cited

U.S. PATENT DOCUMENTS

| | | | | |
|---|---|---|---|---|
| 4,864,387 A | * | 9/1989 | Tatami | 348/499 |
| 2011/0051009 A1 | * | 3/2011 | Cheng et al. | 348/699 |
| 2015/0070065 A1 | * | 3/2015 | Dedic et al. | 327/254 |

* cited by examiner

*Primary Examiner* — Leon-Viet Nguyen
(74) *Attorney, Agent, or Firm* — Sughrue Mion, PLLC (57) ABSTRACT

A half-rate clock data recovery circuit comprises a detector receiving data alternating between even and odd symbols and further receives a four-phase clock. The detector outputs a phase error signal to a phase dissect circuit which outputs an even-symbol phase error and an odd-symbol phase error, which are input to filters to produce first and third control signals. A first 2-bit ADC also receives the even and odd data and outputs even symbol data in accordance with a second phase of the four-phase clock. A second 2-bit ADC also receives the data and outputs odd symbol data in accordance with a fourth phase of the four-phase clock. The even and odd symbol data are input into respective vertical eye monitors which output second and fourth control signals. A quadrature clock generator adjusts the clock based on the control signals. A method uses the half-rate clock data recovery circuit.

17 Claims, 5 Drawing Sheets

HALF-RATE CLOCK-DATA RECOVERY CIRCUIT AND METHOD THEREOF

BACKGROUND OF THE INVENTION

1. Field of the Invention

The present invention generally relates to clock-data recovery.

2. Description of Related Art

Persons of ordinary skill in the art understand terms and basic concepts related to microelectronics that are used in this disclosure, such as "signal," "clock," "half-rate," "edge (of clock)," "binary," "vertical eye opening," "binary phase detector," "filter," "voltage-controlled oscillator," "ternary," "current-mode," "charge-pump," "ADC (analog-to-digital converter)." Terms and basic concepts like these are apparent to those of ordinary skill in the art and thus will not be explained in detail here.

A prior art half-rate clock-data recovery circuit is a circuit that receives a signal comprising a stream of serial binary symbols of a symbol period $T_s$. The circuit establishes a 4-phase recovered clock that is aligned with a timing of the received signal, wherein a period of the 4-phase recovered clock is $2 \cdot T_s$ i.e., twice of the symbol period $T_s$.

Figure 1A:
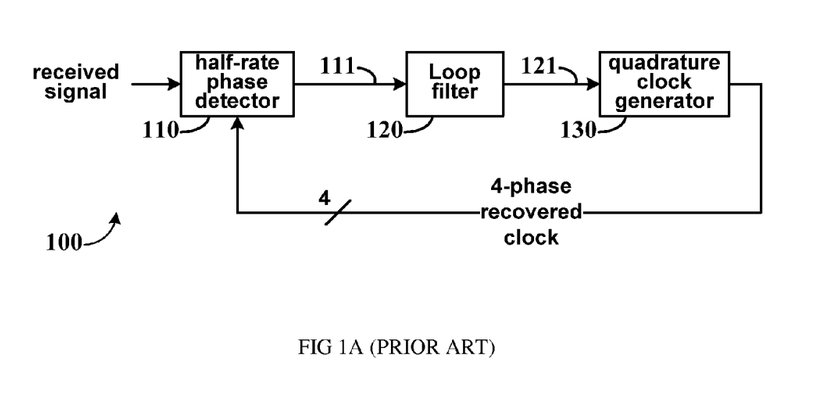
FIG. 1A shows a functional block diagram of a prior art half-rate clock-data recovery circuit.

As depicted in FIG. 1A, a prior art half-rate clock-data recovery circuit 100 comprises: a half-rate phase detector 110 for receiving the received signal and the 4-phase recovered clock. The half-rate phase detector outputs a phase error signal 111 (which is usually a current-mode ternary signal). A loop filter 120 receives the phase error signal 111 and outputs a control signal 121 (which is usually a voltage signal). A quadrature clock generator 130 (which is usually a voltage-controlled oscillator) receiving the control signal 121 and outputs the 4-phase recovered clock. The 4-phase recovered clock is established in a closed-loop manner to track a timing of the received signal. Half-rate clock-data recovery circuit 100 is well known in prior art and thus not described in detail here.

Figure 1B:
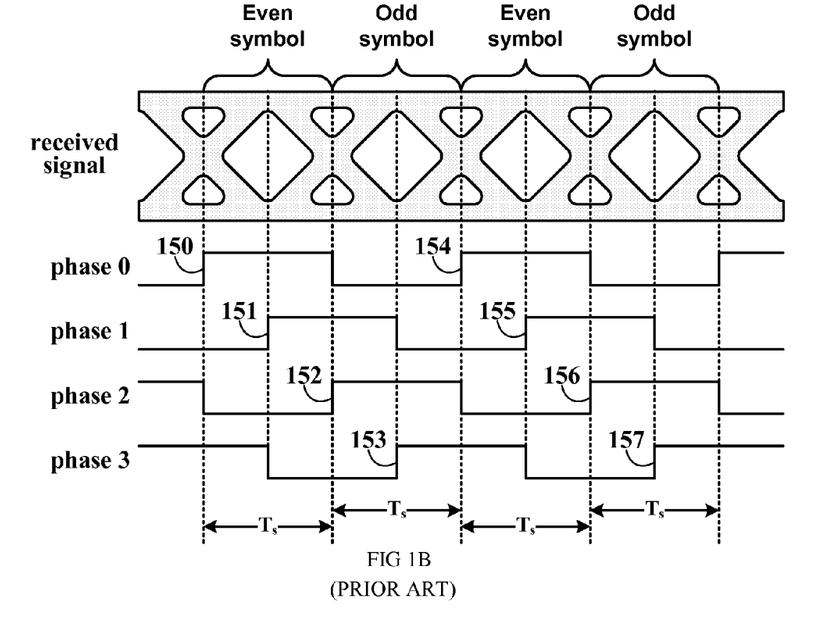
FIG. 1B shows an exemplary timing diagram of the prior art half-rate clock-data recovery circuit of FIG. 1A.

An exemplary waveform of a prior art half-rate clock-data recovery circuit, as observed by using an oscilloscope, is shown in FIG. 1B. The received signal, when observed using an oscilloscope, comprises a stream of binary symbols that exhibits an "eye" pattern. The recovered clock, on the other hand, is a 4-phase square wave, comprising phase 0, phase 1, phase 2, and phase 3. The binary symbols alternate between an even symbol and an odd symbol. An edge (i.e., rising edge) of phase 0 aligns with a transition from an odd symbol to an even symbol (e.g., edges 150 and 154); an edge (i.e., rising edge) of phase 1 aligns with a center of an even symbol (e.g., edges 151 and 155); an edge (i.e., rising edge) of phase 2 aligns with a transition from an even symbol to an odd symbol (e.g., edges 152 and 156); and an edge (i.e., rising edge) of phase 3 aligns with a center of an odd symbol (e.g., edges 153 and 157). Once the edges of phase 0 and phase 2 are properly aligned by using a clock-recovery circuit, the even symbols can be detected by sampling the received signal in accordance with the edge of phase 1, and the odd symbols can be detected by sampling the received signal in accordance with the edge of phase 3.

Figure 1C:
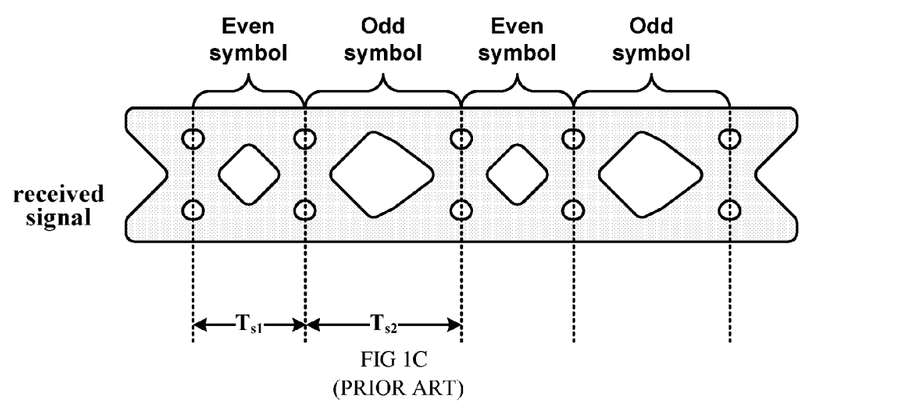
FIG. 1C shows an exemplary timing diagram of a received signal for which the prior art half-rate clock-data recovery circuit of FIG. 1A may not work well.

There is a problem associated with the prior art half-rate clock-data recovery circuit 100. An "eye" of a received signal might be assymmetrical, and also an "eye" of an even symbol may be different from an "eye" of an odd symbol of received signal. As illustrated in another exemplary timing diagram shown in FIG. 1C, a symbol period $T_{s1}$ of an even symbol is different from a symbol period $T_{s2}$ of an odd symbol, due to a duty-cycle distortion. Moreover, an "eye" of an odd symbol is assymmetrical. In this case, the prior art half-rate clock-data recovery circuit 100 may not work well because there is no guarantee each of the four phases of the four-phase recovered clock is optimally timed, with respect to the received signal.

What is desired is a half-rate clock-data recovery circuit that can overcome the aforementioned problems.

BRIEF SUMMARY OF THE INVENTION

The present invention improves performance of a half-rate clock-data recovery circuit over conventionally known circuits by optimizing each phase of a four-phase recovered clock with respect to a received signal.

The present invention establishes an optimal half-rate four-phase recovered clock in response to a received signal, wherein the half-rate four-phase recovered clock comprises four phases and each of the four phases is adjusted to a respective optimal timing.

The present invention establishes a half-rate, four-phase recovered clock comprising a first phase, a second phase, a third phase, and a fourth phase, in response to a received signal comprising a stream of binary symbols alternating between an even symbol and an odd symbol, such that the first phase is aligned with a transition of the received signal from an odd symbol to an even symbol, the second phase is aligned with a timing where a vertical eye opening of an even symbol is maximal, the third phase is aligned with a transition of the received signal from an even symbol to an odd symbol, and the fourth phase is aligned with a timing where a vertical eye opening of an odd symbol is maximal.

In an exemplary embodiment, a circuit comprises: a half-rate phase detector receiving a signal comprising a stream of binary symbols alternating between an even symbol and an odd symbol, and further receiving a four-phase clock comprising a first phase, a second phase, a third phase, and a fourth phase, and outputting a phase error signal; a phase error dissect circuit receiving the phase error signal and outputting an even-symbol phase error signal and an odd-symbol phase error signal; a first 2-bit ADC (analog-to-digital converter) receiving the received signal and outputting an even-symbol data in accordance with the second phase (of the four-phase clock); a second 2-bit ADC receiving the received signal and outputting an odd-symbol data in accordance with the fourth phase (of the four-phase clock); a first filter receiving the even-symbol phase error signal and outputting a first control signal; a first vertical eye monitor circuit receiving the even-symbol data and outputting a second control signal; a second filter receiving the odd-symbol phase error signal and outputting a third control signal; a second vertical eye monitor circuit receiving the odd-symbol data and outputting a fourth control signal; and a quadrature clock generator receiving the first control signal, the second control signal, the third control signal, and the fourth control signal and outputting the four-phase clock. In an exemplary embodiment, the quadrature clock generator comprises: a controlled oscillator outputting the first phase (of the four-phase clock) in accordance with a control by the first control signal; a first variable delay circuit receiving the first phase (of the four-phase clock) and outputting the second phase (of the four-phase clock) in accordance with a control by the second control signal; a second variable delay circuit receiving the first phase (of the four-phase clock) and outputting the third phase (of the four-phase clock) in accordance with the third control signal; and a third variable delay circuit receiving the third phase (of the four-phase clock) and outputting the fourth phase (of the four-phase clock) in accordance with the fourth control signal.

In an exemplary embodiment, a method comprises: receiving a received signal comprising a stream of binary symbols alternating between an even symbol and an odd symbol; establishing a phase error signal by detecting a timing difference between the received signal and a four-phase clock comprising a first phase, a second phase, a third phase, and a fourth phase, using a half-rate phase detector; dissecting the phase error signal into an even-symbol phase error signal and an odd-symbol phase error signal; performing a two-bit analog-to-digital conversion on the received signal in accordance with the second phase (of the four-phase clock) to generate an even-symbol data; performing a two-bit analog-to-digital conversion on the received signal in accordance with the fourth phase (of the four-phase clock) to generate an odd-symbol data; filtering the even-symbol phase error signal to establish a first control signal; monitoring a vertical eye opening of an even symbol of the received signal based on statistics of the even-symbol data to establish a second control signal; filtering the odd-symbol phase error signal to establish a third control signal; monitoring a vertical eye opening of an odd symbol of the received signal based on statistics of the odd-symbol data to establish a fourth control signal; and controlling the four-phase clock in accordance with the first control signal, the second control signal, the third control signal, and the fourth control signal. In an exemplary embodiment, controlling the four-phase clock comprises: outputting the first phase (of the four-phase clock) using a controlled oscillator controlled by the first control signal; delaying the first phase (of the four-phase clock) to establish the second phase (of the four-phase clock) in accordance with a control by the second control signal; delaying the first phase (of the four-phase clock) to establish the third phase (of the four-phase clock) in accordance with a control by the third control signal; and delaying the third phase (of the four-phase clock) to establish the fourth phase (of the four-phase clock) in accordance with a control by the fourth control signal.

In an exemplary embodiment, a method comprises: receiving a received signal comprising a stream of binary symbols alternating between an even symbol and an odd symbol; receiving a four-phase clock comprising a first phase, a second phase, a third phase, and a fourth phase; detecting a timing error of the first phase using a timing of a transition of the received signal from an odd symbol to an even symbol as a reference; detecting a timing error of the third phase using a timing of a transition of the received signal from an even symbol to an odd symbol as a reference; detecting a timing error of the second phase using an optimal timing where a vertical eye opening of an even symbol of the received signal is maximal as a reference; detecting a timing error of the fourth phase using an optimal timing where a vertical eye opening of an odd symbol of the received signal is maximal as a reference; adjusting the first phase in accordance with the timing error of the first phase; adjusting the second phase in accordance with the timing error of the second phase; adjusting the third phase in accordance with the timing error of the third phase; and adjusting the fourth phase in accordance with the timing error of the fourth phase.

DETAILED DESCRIPTION OF THE INVENTION

The present invention relates to half-rate clock-data recovery. The specification describes several exemplary embodiments of the invention considered as favorable modes of practicing the invention. However, it should be understood that the invention can be implemented by one of ordinary skill in the art in many ways and is not limited to the particular examples described below or to the particular manner in which any features of such examples are implemented. In other instances, well-known details are not shown or described to avoid obscuring aspects of the invention.

Figure 2A:
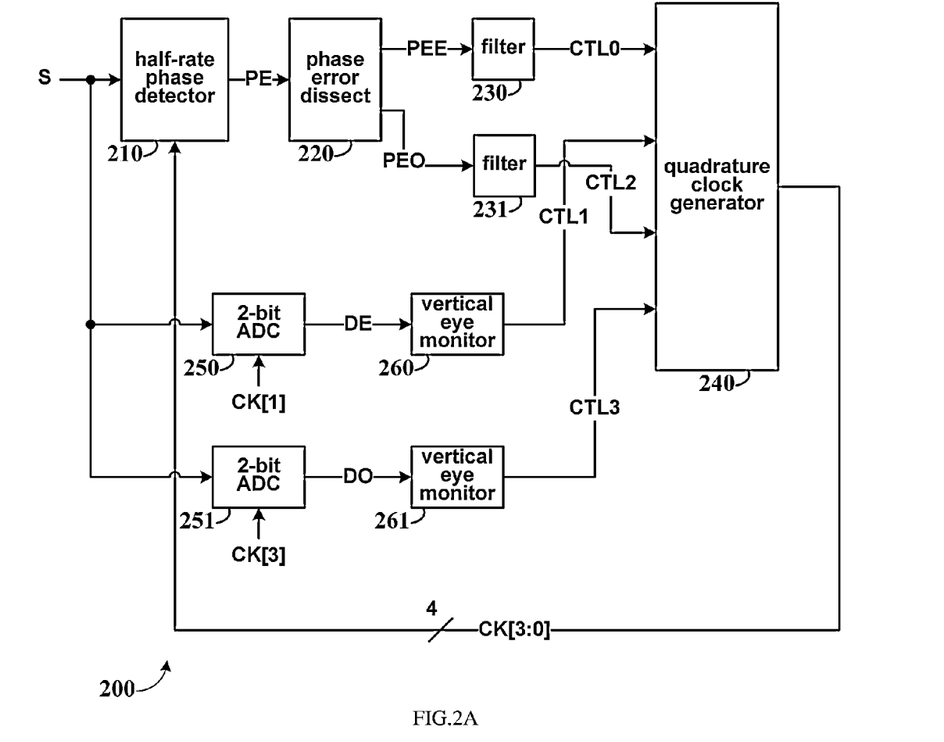
FIG. 2A shows a functional block diagram of a half-rate clock-data recovery circuit in accordance with an embodiment of the present invention.

A functional block diagram of a clock-data recovery circuit 200 in accordance with an embodiment of the present invention is shown in FIG. 2A. Clock-data recovery circuit 200 receives a received signal S and outputs a 4-phase recovered clock CK[3:0] aligned with a timing of the received signal S. The 4-phase recovered clock CK[3:0] comprises a first phase CK[0], a second phase CK[1], a third phase CK[2], and a fourth phase CK[3]. The received signal S comprises a stream of binary symbols alternating between an even symbol and an odd symbol. An average symbol period of the received signal S is $T_s$. A period of the 4-phase recovered clock CK[3:0] is $2 \cdot T_s$. Clock-data recovery circuit 200 comprises: a half-rate phase detector 210 receiving the received signal S and the 4-phase recovered clock CK[3:0] and outputting a phase error signal PE; a phase error dissect circuit 220 receiving the phase error signal PE and outputting an even-symbol phase error signal PEE and an odd-symbol phase error signal PEO; a first 2-bit ADC (analog-to-digital converter) 250 converting the received signal S into an even-symbol data DE in accordance with a timing of the second phase CK[1]; a second 2-bit ADC 251 converting the received signal S into an odd-symbol data DO in accordance with a timing of the fourth phase CK[3]; a first filter 230 filtering the even-symbol phase error signal PEE into a first control signal CTL0; a first vertical eye monitor circuit 260 receiving the even-symbol data DE and outputting a second control signal CTL1; a second filter 231 filtering the odd-symbol phase error signal PEO into a third control signal CTL2; a second vertical eye monitor circuit 261 receiving the odd-symbol data DO and outputting a fourth control signal CTL3; and a quadrature clock generator 240 receiving the first control signal CTL0, the second control signal CTL1, the third control signal CTL2, and the fourth control signal CTK3 and outputting the 4-phase recovered clock CK[3:0].

Figure 3:
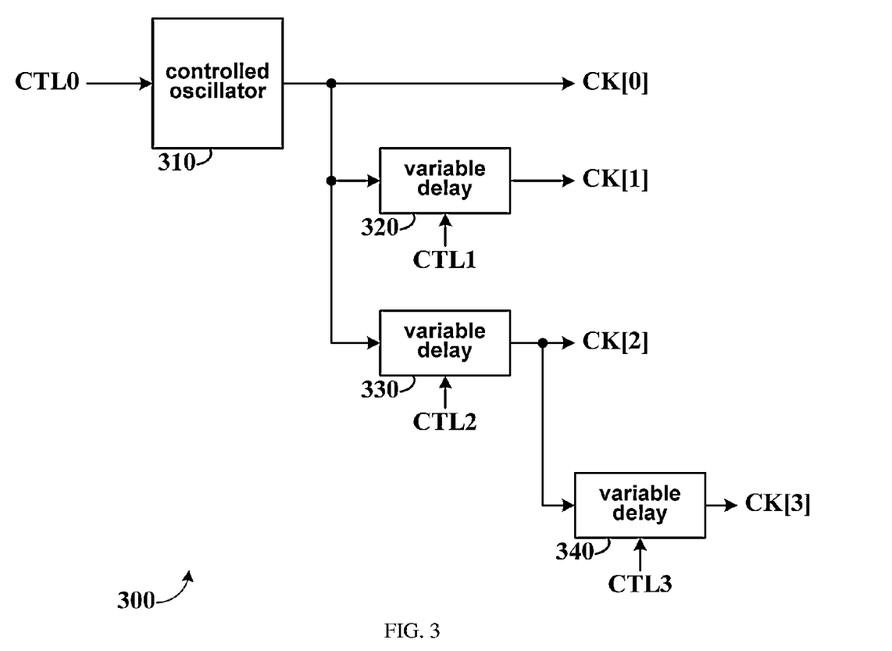
FIG. 3 shows an example of a quadrature clock generator for the half-rate clock-data recovery circuit of FIG. 2A.

A functional block diagram of a quadrature clock generator 300 suitable for embodying the quadrature clock generator 240 of FIG. 2A is depicted in FIG. 3. Quadrature clock generator 300 comprises: a controlled oscillator 310 outputting CK[0] in accordance with a control by CTL0; a first variable delay circuit 320 receiving CK[0] and outputting CK[1] in accordance with a control by CTL1; a second variable delay circuit 330 receiving CK[0] and outputting CK[2] in accordance with a control by CTL2; and a third variable delay circuit 340 receiving CK[2] and outputting CK[3] in accordance with a control by CTL3. Each of CTL0, CTL1, CTL2, and CTL3 can be either a voltage signal or a digital code. In an exemplary embodiment, CTL0 is a voltage signal, and the controlled oscillator 310 is a voltage-controlled oscillator, which is conventionally known and thus not described in detail here. In another embodiment, CTL0 is a digital code, and the controlled oscillator 310 is a digitally controlled oscillator, which is conventionally known and thus not described in detail here. In an embodiment, CTL1 is a voltage signal, and the first variable delay circuit 320 is a voltage controlled delay circuit, which is conventionally known and thus not described in detail here. In another embodiment, CTL1 is a digital code, and the first variable delay circuit 320 is a digitally controlled delay circuit, which is conventionally known and thus not described in detail here. In an embodiment, CTL2 is a voltage signal, and the second variable delay circuit 330 is a voltage controlled delay circuit. In another embodiment, CTL2 is a digital code, and the second variable delay circuit 330 is a digitally controlled delay circuit. In an embodiment, CTL3 is a voltage signal, and the third variable delay circuit 340 is a voltage controlled delay circuit. In another embodiment, CTL3 is a digital code, and the third variable delay circuit 340 is a digitally controlled delay circuit.

Figure 2B:
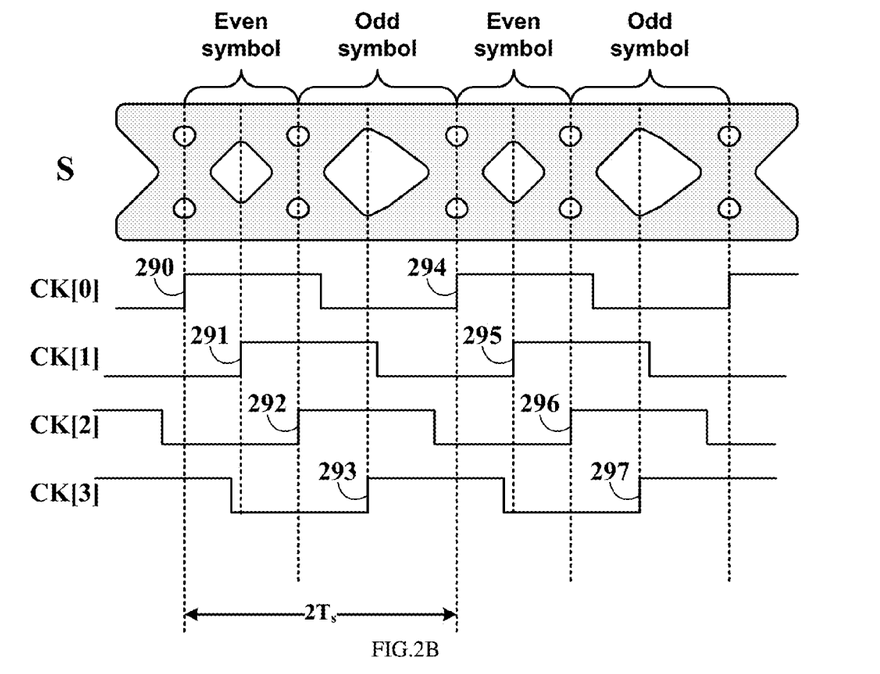
FIG. 2B shows an exemplary timing diagram of the half-rate clock-data recovery circuit of FIG. 2A.

An exemplary timing diagram of the clock-data recovery circuit 200 of FIG. 2A is shown in FIG. 2B. As shown, the received signal S comprises a stream of binary symbols alternating between an even symbol and an odd symbol. The 4-phase recovered clock CK[3:0] is established in a closed-loop manner to align with a timing of the received signal S. The first phase CK[0] is controlled by the first control signal CTL0 so as to align with a transition of the received signal S from an odd symbol to an even symbol (e.g. edges 290 and 294). The second phase CK[1] is controlled by the second control signal CTL1 so as to align with a timing of a maximal vertical eye opening of an even symbol (e.g. edges 291 and 295). The third phase CK[2] is controlled by the third control signal CTL2 so as to align with a transition of the received signal S from an even symbol to an odd symbol (e.g. edges 292 and 296). The fourth phase CK[3] is controlled by the fourth control signal CTL3 so as to align with a timing of a maximal vertical eye opening of an odd symbol (e.g. edges 293 and 297). By way of example but not limitation, the mean symbol period $T_s$ is 100 ps, and a period of the 4-phase recovered clock CK[3:0] is 200 ps. As shown in FIG. 2B, each of the four phases of CK[3:0] is optimally timed to allow an optimal performance for the half-rate clock-data recovery circuit 200.

Half-rate phase detector 210 of FIG. 2A is a circuit that detects a timing error of a half-rate clock (i.e., CK[3:0]) with respect to a received signal (i.e., S). In one embodiment, a half-rate binary phase detector is used. A half-rate binary phase detector is conventionally known and thus not described in detail here. The resultant phase error signal PE is a ternary signal of three possible values: 1, −1, and 0, indicating that a timing of the 4-phase recovered clock CK[3:0] is too slow, too fast, or unsure, respectively. Since a timing error of an even symbol might be different from a timing error of an odd symbol, the phase error dissect circuit 220 is used to separate a timing error of the odd symbol from the timing error of the even symbol. The even-symbol phase error signal PEE is taken from an even sample of the phase error signal PE, while the odd-symbol phase error signal PEO is taken from a difference between an odd sample and a preceding even sample of the phase error signal PE. That is, $$PEE_n = PE_{2n} \tag{1}$$

$$PEO_n = PE_{2n+1} - PE_{2n} \tag{2}$$

Figure 2C:
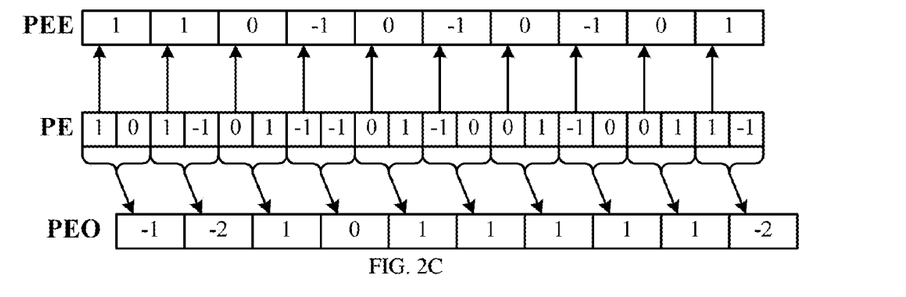
FIG. 2C shows an example of phase error dissect of the half-rate clock-data recovery circuit of FIG. 2A.

Here, n denotes an index. An example for illustrating equations (1) and (2) is shown in FIG. 2C. Note that PEE represents a timing error of an even symbol, while PEO represents a timing error of an odd symbol relative to a preceding even symbol.

In an exemplary embodiment, PEE is output to the first filter 230 as a digital signal of three possible values: 1, −1, and 0. In another exemplary embodiment, PEE is output to the first filter 230 in a current-mode representation using a charge pump circuit. A current-mode representation of a phase error signal using a charge pump circuit is conventionally known and thus not described in detail here.

In an exemplary embodiment, PEO is output to the second filter 231 as a digital signal of five possible values: 2, 1, 0, −1, and −2. In another exemplary embodiment, PEO is output to the second filter 231 in a current-mode representation using a charge pump circuit.

In an alternative embodiment, PEE is taken from a sum of an even sample and a succeeding odd sample of the phase error signal PE, that is:

$$PEE_n = PE_{2n} + PE_{2n+1} \tag{3}$$

Using Equation (3) allows a clock recovery that converges faster but noisier, compared with using Equation (1).

In an embodiment, the first filter 230 comprises a serial connection of a resistor and a capacitor for providing a termination to the even-symbol phase error signal PEE to establish the first control signal CTL0. In this case, PEE is a current-mode signal, and CTL0 is a voltage signal. In another embodiment, the first filter 230 is a digital filter that sums PEE with an integral of PEE. In this case, PEE is a digital signal and CTL0 is a digital code.

In an embodiment, the second filter 231 comprises a capacitor for providing a termination to the odd-symbol phase error signal PEO to establish the third control signal CTL2. In this case, PEO is a current-mode signal, and CTL2 is a voltage signal. In another embodiment, the second filter 231 is a digital integrator that integrates PEO. In this case, PEO is a digital signal and CTL2 is a digital code.

Using a 2-bit ADC along with a vertical eye monitor to establish an optimal timing for sampling a received signal has been disclosed by the present inventor in co-pending patent application [Clock-Data Recovery Circuit and Method Thereof, U.S. Ser. No. 14/489,846], the disclosure of which is incorporated by reference. However, since half-rate architecture is used here, an optimal timing for sampling the received signal S for an even symbol is different from an optimal timing for sampling the received signal S for an odd symbol. Therefore, two sets of such circuits are needed. The first set comprises the first 2-bit ADC 250 and the first vertical eye monitor circuit 260 for generating CTL1 that establishes an optimal timing of CK[1] (via the first variable delay circuit 320 of FIG. 3) by monitoring a vertical eye of an even symbol of the received signal S based on observing statistics of the even-symbol data DE. CTL1 is adjusted in a closed loop manner to let CK[1] align with an optimal sampling instant for an even symbol of the received signal S such that a vertical eye opening is maximized. The second set comprises the second 2-bit ADC 251 and the second vertical eye monitor circuit 261 for generating CTL3 that establishes an optimal timing of CK[3] (via the third variable delay circuit 340 of FIG. 3) by monitoring a vertical eye for an odd symbol of the received signal S based on observing statistics of the odd-symbol data DO. CTL3 is adjusted in a closed loop manner to let CK[3] align with an optimal sampling instant for an odd symbol of the received signal S such that a vertical eye opening is maximized. Principle of using statistics of a two-bit data to monitor a vertical eye opening of a binary symbol is taught by the present inventor in the aforementioned patent application and thus not described in detail here. The first-fourth control signals indicate a timing error of respective phases, which are input to the quadrature clock generator 240 to adjust the phase input to the half-rate phase detector.

Those skilled in the art will readily observe that numerous modifications and alterations of the device and method may be made while retaining the teachings of the invention. Accordingly, the invention should not be limited by the exemplary embodiments, but is described by the appended claims and equivalents thereof.

What is claimed is:

1. A circuit comprising:
   a half-rate phase detector receiving a received signal comprising a stream of binary symbols alternating between an even symbol and an odd symbol, and further receiving a four-phase clock comprising a first phase, a second phase, a third phase, and a fourth phase, said half-rate phase detector outputting a phase error signal;
   a phase error dissect circuit receiving the phase error signal and outputting an even-symbol phase error signal and an odd-symbol phase error signal;
   a first 2-bit ADC (analog-to-digital converter) receiving the received signal and outputting an even-symbol data in accordance with the second phase of the four-phase clock;
   a second 2-bit ADC receiving the received signal and outputting an odd-symbol data in accordance with the fourth phase of the four-phase clock;
   a first filter receiving the even-symbol phase error signal and outputting a first control signal;
   a first vertical eye monitor circuit receiving the even-symbol data and outputting a second control signal;
   a second filter receiving the odd-symbol phase error signal and outputting a third control signal;
   a second vertical eye monitor circuit receiving the odd-symbol data and outputting a fourth control signal; and
   a quadrature clock generator receiving the first control signal, the second control signal, the third control signal, and the fourth control signal and outputting the four-phase clock.

2. The circuit of claim 1, wherein the received signal has a period of symbol $T_1$, and a period of the four-phase clock is $2T_1$.

3. The circuit of claim 2, wherein the half-rate phase detector is a half-rate binary phase detector, and the phase error signal is a ternary signal.

4. The circuit of claim 2, wherein the even-symbol phase error signal represents a timing difference between the first phase of the four-phase clock and a transition of the received signal from an odd symbol to an even symbol.

5. The circuit of claim 4, wherein the odd-symbol phase error signal represents a timing difference between the third phase of the four-phase clock and a transition of the received signal from an even symbol to an odd symbol.

6. The circuit of claim 5, wherein the first vertical eye monitor circuit observes a vertical eye opening of an even symbol of the received signal in accordance with statistics of the even-symbol data, and outputs the second control signal to maximize a vertical eye opening of an even symbol of the received signal.

7. The circuit of claim 6, wherein the second vertical eye monitor circuit observes a vertical eye opening of an odd symbol of the received signal in accordance with statistics of the odd-symbol data, and outputs the fourth control signal to maximize a vertical eye opening of an odd symbol of the received signal.

8. The circuit of claim 7, wherein the quadrature clock generator comprises: a controlled oscillator outputting the first phase of the four-phase clock in accordance with the first control signal; a first variable delay circuit receiving the first phase of the four-phase clock and outputting the second phase of the four-phase clock in accordance with the second control signal; a second variable delay circuit receiving the first phase of the four-phase clock and outputting the third phase of the four-phase clock in accordance with the third control signal; and a third variable delay circuit receiving the third phase of the four-phase clock and outputting the fourth phase of the four-phase clock in accordance with the fourth control signal.

9. The circuit of claim 1, wherein the even-symbol phase error signal is taken from an even sample of the phase error signal.

10. The circuit of claim 1, wherein the odd-symbol phase error signal is taken from a difference between an odd sample and a preceding even sample of the phase error signal.

11. A method comprising:
    receiving a received signal comprising a stream of binary symbols alternating between an even symbol and an odd symbol;
    establishing a phase error signal by detecting a timing difference between the received signal and a four-phase clock comprising a first phase, a second phase, a third phase, and a fourth phase, using a half-rate phase detector;
    dissecting the phase error signal into an even-symbol phase error signal and an odd-symbol phase error signal;
    performing a two-bit analog-to-digital conversion on the received signal in accordance with the second phase of the four-phase clock to generate an even-symbol data;
    performing a two-bit analog-to-digital conversion on the received signal in accordance with the fourth phase of the four-phase clock to generate an odd-symbol data;
    filtering the even-symbol phase error signal to establish a first control signal;
    monitoring a vertical eye opening of an even symbol of the received signal based on statistics of the even-symbol data to establish a second control signal using a first vertical eye monitor circuit;
    filtering the odd-symbol phase error signal to establish a third control signal;
    monitoring a vertical eye opening of an odd symbol of the received signal based on statistics of the odd-symbol data to establish a fourth control signal using a second vertical eye monitor circuit; and
    controlling the four-phase clock in accordance with the first control signal, the second control signal, the third control signal, and the fourth control signal in a quadrature clock generator.

12. The method of claim 11, wherein controlling the four-phase clock comprises: outputting the first phase of the four-phase clock using a controlled oscillator controlled by the first control signal; delaying the first phase of the four-phase clock to establish the second phase of the four-phase clock in accordance with the second control signal; delaying the first phase of the four-phase clock to establish the third phase of the four-phase clock in accordance with the third control signal; and delaying the third phase of the four-phase clock to establish the fourth phase of the four-phase clock in accordance with the fourth control signal.

13. A method comprising:
receiving a received signal comprising a stream of binary symbols alternating between an even symbol and an odd symbol;
receiving a four-phase clock comprising a first phase, a second phase, a third phase, and a fourth phase;
detecting a timing error of the first phase using a timing of a transition of the received signal from an odd symbol to an even symbol as a first reference;
detecting a timing error of the third phase using a timing of a transition of the received signal from an even symbol to an odd symbol as a second reference;
detecting a timing error of the second phase using a timing where a vertical eye opening of an even symbol of the received signal is maximal as a third reference;
detecting a timing error of the fourth phase using a timing where a vertical eye opening of an odd symbol of the received signal is maximal as a fourth reference;
adjusting the first phase in accordance with the timing error of the first phase;
adjusting the second phase in accordance with the timing error of the second phase;
adjusting the third phase in accordance with the timing error of the third phase; and
adjusting the fourth phase in accordance with the timing error of the fourth phase.

14. The method of claim 13, wherein adjusting the first phase comprises using a controlled oscillator controlled in accordance with the timing error of the first phase.

15. The method of claim 13, wherein adjusting the second phase comprises using a delay circuit controlled in accordance with the timing error of the second phase.

16. The method of claim 13, wherein adjusting the third phase comprises using a delay circuit controlled in accordance with the timing error of the third phase.

17. The method of claim 13, wherein adjusting the fourth phase comprises using a delay circuit controlled in accordance with the timing error of the fourth phase.

* * * * *